(12) United States Patent
Otsubo et al.

(10) Patent No.: US 11,804,448 B2
(45) Date of Patent: Oct. 31, 2023

(54) MODULE

(71) Applicant: Murata Manufacturing Co., Ltd., Kyoto (JP)

(72) Inventors: Yoshihito Otsubo, Kyoto (JP); Tetsuya Oda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 337 days.

(21) Appl. No.: 17/212,234

(22) Filed: Mar. 25, 2021

(65) Prior Publication Data

US 2021/0217704 A1    Jul. 15, 2021

Related U.S. Application Data

(63) Continuation of application No. PCT/JP2019/039162, filed on Oct. 3, 2019.

(30) Foreign Application Priority Data

Oct. 5, 2018   (JP) ................ 2018-190263

(51) Int. Cl.
  *H01L 23/552*    (2006.01)
  *H01L 23/498*    (2006.01)
  *H01L 25/065*    (2023.01)

(52) U.S. Cl.
  CPC ...... *H01L 23/552* (2013.01); *H01L 23/49822* (2013.01); *H01L 25/0655* (2013.01)

(58) Field of Classification Search
  None
  See application file for complete search history.

(56) References Cited

U.S. PATENT DOCUMENTS

| 11,646,273 B2 * | 5/2023 | Otsubo | H01L 23/552 |
| | | | 257/659 |
| 2013/0271928 A1 * | 10/2013 | Shimamura | H05K 13/00 |
| | | | 29/841 |

(Continued)

FOREIGN PATENT DOCUMENTS

| JP | 2013-222829 A | 10/2013 |
| JP | 2016-072411 A | 5/2016 |

(Continued)

OTHER PUBLICATIONS

International Search Report for PCT/JP2019/039162 dated Nov. 19, 2019.
Written Opinion for PCT/JP2019/039162 dated Nov. 19, 2019.

*Primary Examiner* — Long Pham
(74) *Attorney, Agent, or Firm* — Pearne & Gordon LLP

(57) ABSTRACT

A module is provided with a substrate including a principal surface, a plurality of electronic components arranged on the principal surface, a sealing resin covering the principal surface and the plurality of electronic components and including a trench between any of the plurality of electronic components, a ground electrode arranged on the principal surface, a conductive layer covering the sealing resin, and a magnetic member. The conductive layer is electrically connected to the ground electrode by a connecting conductor arranged so as to penetrate the sealing resin. The magnetic member includes a magnetic plate member arranged so as to cover the sealing resin and a magnetic wall member arranged in a wall shape in the trench. The connecting conductor and the magnetic wall member both fill the trench in a state of being formed in the trench.

20 Claims, 11 Drawing Sheets

(56) References Cited

U.S. PATENT DOCUMENTS

| | | | |
|---|---|---|---|
| 2015/0070851 A1* | 3/2015 | Kitazaki | ............... H01L 21/561 |
| | | | 29/841 |
| 2016/0095267 A1 | 3/2016 | Kitazaki et al. | |
| 2017/0301628 A1 | 10/2017 | Kawabata et al. | |
| 2018/0077829 A1 | 3/2018 | Yamamoto | |
| 2018/0092257 A1 | 3/2018 | Otsubo et al. | |
| 2019/0273312 A1 | 9/2019 | Otsubo | |
| 2019/0363055 A1* | 11/2019 | Yazaki | ................ H01L 23/3121 |

FOREIGN PATENT DOCUMENTS

| | | |
|---|---|---|
| JP | 2017-174949 A | 9/2017 |
| WO | 2016/181954 A1 | 11/2016 |
| WO | 2016/186103 A1 | 11/2016 |
| WO | 2018/101384 A1 | 6/2018 |
| WO | 2018/159290 A1 | 9/2018 |

\* cited by examiner

MODULE

CROSS REFERENCE TO RELATED APPLICATIONS

This is a continuation of International Application No. PCT/JP2019/039162 filed on Oct. 3, 2019 which claims priority from Japanese Patent Application No. 2018-190263 filed on Oct. 5, 2018. The contents of these applications are incorporated herein by reference in their entireties.

BACKGROUND

Technical Field

The present disclosure relates to a module.

In Japanese Patent Application Laid-Open No. 2013-222829 (Patent Document 1) describes that, in a module in which a plurality of electronic components are arranged, a shielding member containing a metal material is provided so that a mounting surface on which the electronic components are mounted is separated into a plurality of regions.

Patent Document 1: Japanese Patent Application Laid-Open No. 2013-222829

BRIEF SUMMARY

In recent years, in a module for use as a communication device, components constituting circuits of a power supply system as well as components for wireless communication are mounted with high density to meet the demand for size reduction. In this case, as the mounting density of the components in the module increases, it is necessary to strengthen not only an electromagnetic shield for suppressing an influence of an electromagnetic wave but also a magnetic shield, and a shielding structure satisfying both the electromagnetic shield and the magnetic shield is required. The shielding member described in Patent Document 1 is either a "metal member" functioning as the electromagnetic shield or an "electromagnetic wave absorber containing a soft magnetic material" functioning as the magnetic shield and has only one of the functions.

The present disclosure provides a module satisfying both an electromagnetic shield and a magnetic shield in a favorable state.

A module according to the present disclosure is provided with a substrate including a principal surface, a plurality of electronic components arranged on the principal surface, a sealing resin covering the principal surface and the plurality of electronic components and including a trench between any of the plurality of electronic components, a ground electrode arranged on the principal surface, a conductive layer covering the sealing resin, and a magnetic member. The conductive layer is electrically connected to the ground electrode by a connecting conductor arranged so as to penetrate the sealing resin. The magnetic member includes a magnetic plate member arranged so as to cover the sealing resin and a magnetic wall member arranged in a wall shape in the trench. The connecting conductor and the magnetic wall member both fill the trench in a state of being formed in the trench.

According to the present disclosure, it is possible to satisfy both an electromagnetic shield and a magnetic shield in a favorable state.

DETAILED DESCRIPTION

Figure 1:
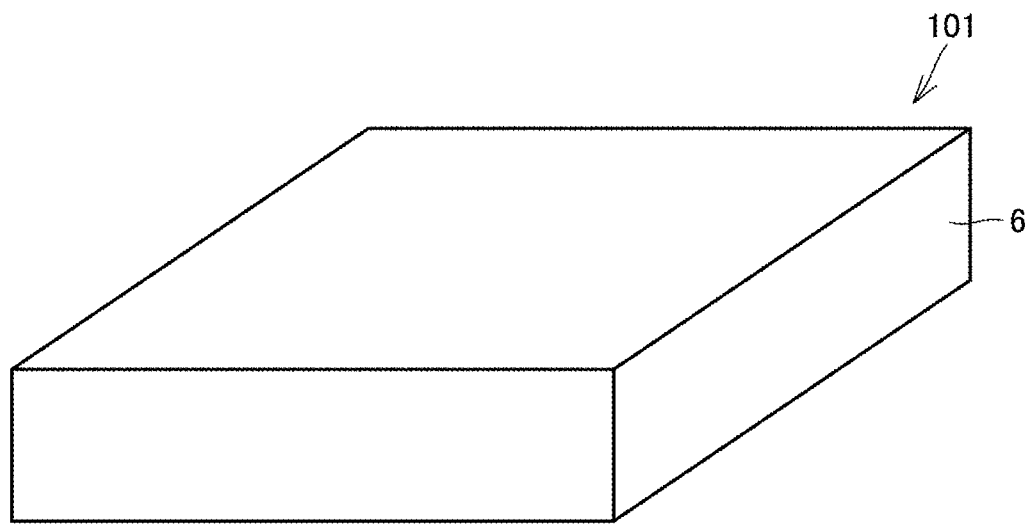
FIG. 1 is a first perspective view of a module according to Embodiment 1 based on the present disclosure.

The dimensional ratios illustrated in the drawings do not necessarily represent an accurate and actual situation, and the dimensional ratios may be exaggerated for convenience of description. In the following description, in a case in which a concept of an upper or lower side is referred to, the upper or lower side does not necessarily mean an absolute upper or lower side and may mean a relative upper or lower side in the illustrated posture.

Embodiment 1

Figure 2:
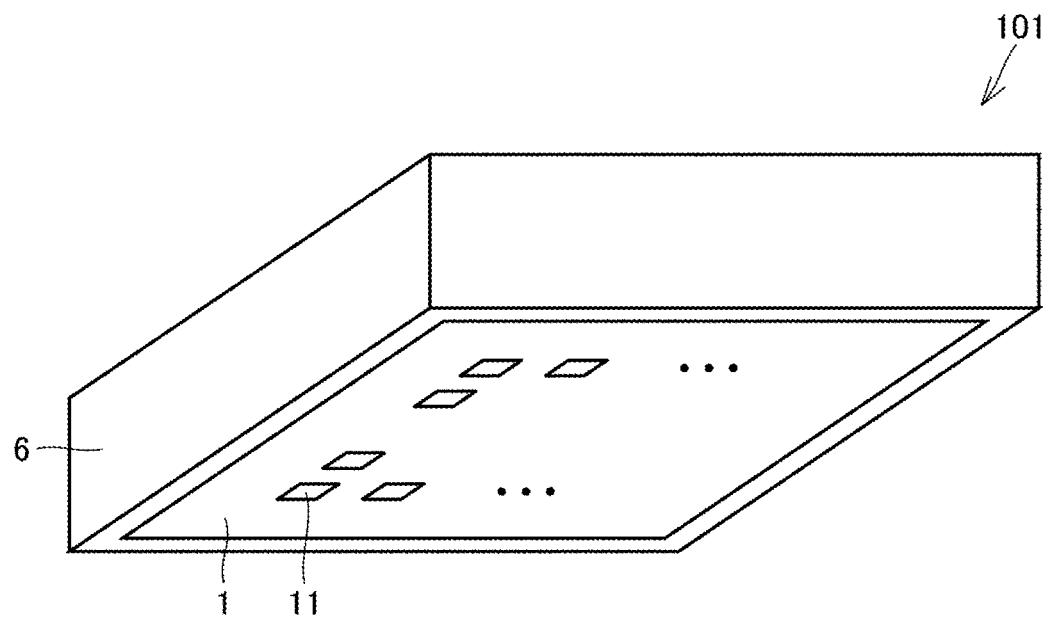
FIG. 2 is a second perspective view of the module according to Embodiment 1 based on the present disclosure.
Figure 3:
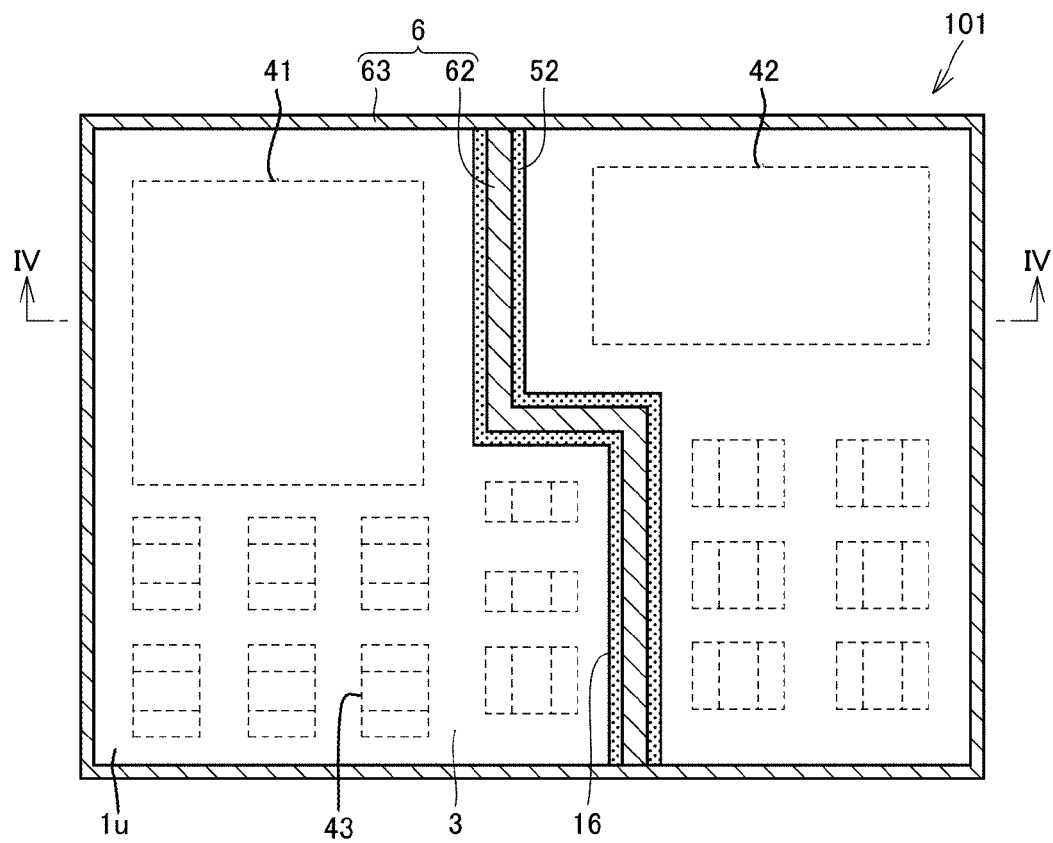
FIG. 3 is a plan view of the module according to Embodiment 1 based on the present disclosure.
Figure 4:
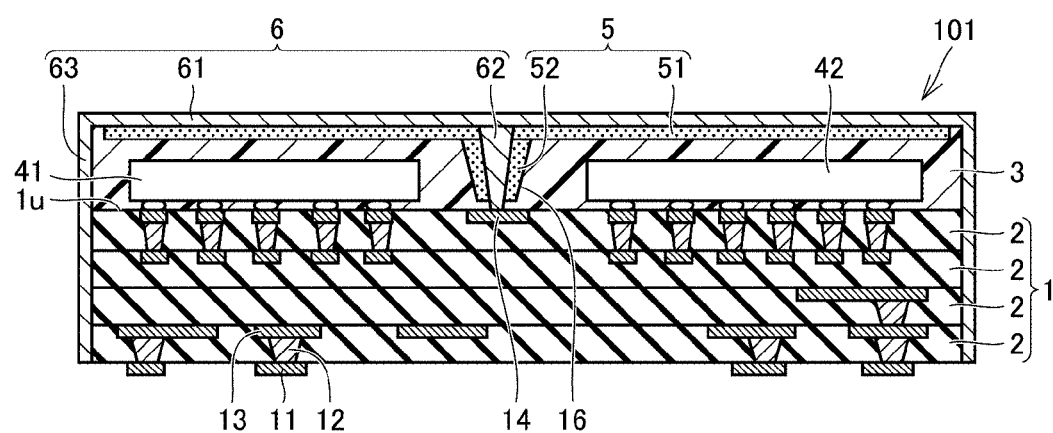
FIG. 4 is a sectional view taken along the line IV-IV in FIG. 3.

A module according to Embodiment 1 based on the present disclosure will be described with reference to FIGS. 1 to 4. An external view of a module 101 according to the present embodiment is illustrated in FIG. 1. An upper surface and a side surface of the module 101 are covered with a conductive layer 6. The module 101 in FIG. 1 as viewed obliquely from a lower side is illustrated in FIG. 2. A lower surface of the module 101 is not covered with the conductive layer 6 and has a substrate 1 exposed therefrom. A lower surface of the substrate 1 is provided with one or more external connection electrodes 11. The number, size, and arrangement of the external connection electrodes 11 illustrated in FIG. 2 are illustrative only. The substrate 1 may be provided with wires on the surface or inside. The substrate 1 may be a resin substrate or a ceramic substrate. The substrate 1 may be a multilayer substrate. A plan view of the module 101 is illustrated in FIG. 3. FIG. 3 corresponds to a view, viewed from an upper side, of a state in which an upper surface of the conductive layer 6 of the module 101 is removed. A sectional view taken along the line IV-IV in FIG. 3 is illustrated in FIG. 4. Electronic components 41, 42, and 43 are mounted on a principal surface 1u of the substrate 1. The electronic components 41, 42, and 43 are covered with a mold resin 3. The electronic components 41 and 42 may be integrated circuits (ICs), for example. Each of the external connection electrodes 11 is electrically connected to an internal conductor pattern 13 with a conductor via 12 provided so as to penetrate an insulating layer 2 interposed therebetween. In the example illustrated in FIG. 4, the substrate 1 is a lamination of the plurality of insulating layers 2.

The module 101 according to the present embodiment is provided with the substrate 1 including the principal surface 1u, the plurality of electronic components 41, 42, and 43 arranged on the principal surface 1u, the sealing resin 3 covering the principal surface 1u and the plurality of electronic components 41, 42, and 43 and including a trench 16 between any of the plurality of electronic components, a ground electrode 14 arranged on the principal surface 1u, the conductive layer 6 covering the sealing resin 3, and a magnetic member 5. The conductive layer 6 includes a portion 61 covering an upper surface of the sealing resin 3, a connecting conductor 62 arranged so as to penetrate the sealing resin 3, and a portion 63 covering a side surface of the sealing resin 3. The conductive layer 6 is electrically connected to the ground electrode 14 by the connecting conductor 62. The magnetic member 5 includes a magnetic plate member 51 arranged so as to cover the sealing resin 3 and a magnetic wall member 52 arranged in a wall shape in the trench 16. The connecting conductor 62 and the magnetic shield wall-shaped portion 52 both fill the trench 16 in a state of being formed in the trench 16. The magnetic wall member 52 is arranged between the plurality of electronic components.

The magnetic material to be filled in the trench may be an alloy, such as an Fe—Co-based alloy and an Fe—Ni-based alloy or a ferrite material, such as NiZn and MnZn, for example. Alternatively, the magnetic material may be permalloy plating. The term "permalloy plating" as used herein means plating containing an Ni—Fe alloy. The conductive layer 6 can contain metal. The conductive layer 6 can contain copper, aluminum, gold, or an alloy containing any of these, for example.

In the present embodiment, the conductive layer 6 serves as an electromagnetic shield shielding an electromagnetic wave, and the magnetic member 5 serves as a magnetic shield shielding magnetism. In the present embodiment, since the connecting conductor 62 and the magnetic wall member 52 both fill the trench 16 in a state of being formed in the trench 16, the connecting conductor 62 and the magnetic wall member 52 can be arranged compactly in a narrow space. As a result, it is possible to satisfy both an electromagnetic shield and a magnetic shield in a favorable state.

In the present embodiment, since the width of a portion required for a shielding structure, that is, the width of the trench 16 in the present embodiment, can be reduced, a risk of damage to the mounted components at the time of forming the trench 16 can be mitigated. Also, as illustrated in FIG. 4, by employing a structure in which the connecting conductor 62 that fills a part of the internal space of the trench 16 is connected to the ground electrode 14 serving as a land electrode arranged on the principal surface 1u, space on the principal surface 1u of the substrate 1 can be saved, and a larger area for mounting components and the like can be secured. It is also possible to strengthen a magnetic shield for a specific component.

As illustrated in the present embodiment, a configuration may be employed in which the connecting conductor 62 and the magnetic shield wall-shaped portion 52 extend in parallel in a case of being viewed in a direction perpendicular to the principal surface 1u. By employing this configuration, the electromagnetic shield and the magnetic shield can fully and reliably be provided along a desired path in a planar view.

As illustrated in FIG. 4, while the lower end of the connecting conductor 62 is connected to the ground electrode 14, the lower end of the magnetic wall member 52 is not connected to the ground electrode 14. The lower end of the magnetic wall member 52 is not required to be connected to a certain conductor pattern. Although the conductive layer 6 can be electrically connected to the ground electrode 14, the magnetic member 5 is optionally electrically connected to the ground electrode 14. In order to serve as a magnetic shield, the magnetic wall member 52 is not necessarily required to fully separate the sealing resin 3 from the upper end to the lower end of the sealing resin 3 but is merely required to exist as a wall having a certain area. For example, the lower end of the magnetic wall member 52 may be located slightly above the lower end of the sealing resin 3. That is, there may be a gap between the lower end of the magnetic wall member 52 and the principal surface 1u of the substrate 1. The reason for this is that the magnetic material functions as a magnetic shield in a mechanism of absorbing magnetism and converting the magnetism into heat.

(Manufacturing Method)

The structure described in the present embodiment can be manufactured in the following manner. First, the sealing resin 3 is formed so as to seal the electronic components 41, 42, and the like mounted on the principal surface 1u. A part of the trench 16 is formed in the sealing resin 3 by laser processing or the like. The part of the trench 16 referred to here is hereinbelow referred to as a "first groove". The first groove is for the magnetic wall member 52. As can be read from the shape of the magnetic wall member 52 in FIG. 4, the first groove may be or may not be as deep as to reach the principal surface 1u. The first groove is filled with a paste of a magnetic material. The paste of the magnetic material is fixed to cause the magnetic wall member 52 to be formed. Subsequently, the magnetic plate member 51 is formed. The magnetic plate member 51 can be formed by a method, such as application of a paste of a magnetic material, attachment of a magnetic material sheet, and plating of a magnetic material. Subsequently, a groove is formed along the center line of the magnetic wall member 52 by laser processing or the like. This groove is hereinbelow referred to as a "second groove". The second groove is as deep as to reach the principal surface 1u. The second groove is filled with a paste of a conductive material. As a result, the connecting conductor 62 is formed. Subsequently, the conductive layer 6 is formed by a method, such as application of a conductor paste and sputtering. In this manner, the structure illustrated in FIG. 4 is obtained. The connecting conductor 62 is in a state of being electrically connected to the ground electrode 14 arranged on the principal surface 1u. The magnetic wall member 52 may or may not reach the principal surface 1u.

In order to minimize damage caused to the principal surface 1*u* by laser processing or the like, the magnetic wall member 52 can be formed so as not to reach the principal surface 1*u*. That is, as described in the present embodiment, the connecting conductor 62 is connected to the ground electrode 14, and in one option, the magnetic member 5 is not to be connected to the ground electrode 14.

Embodiment 2

Figure 5:
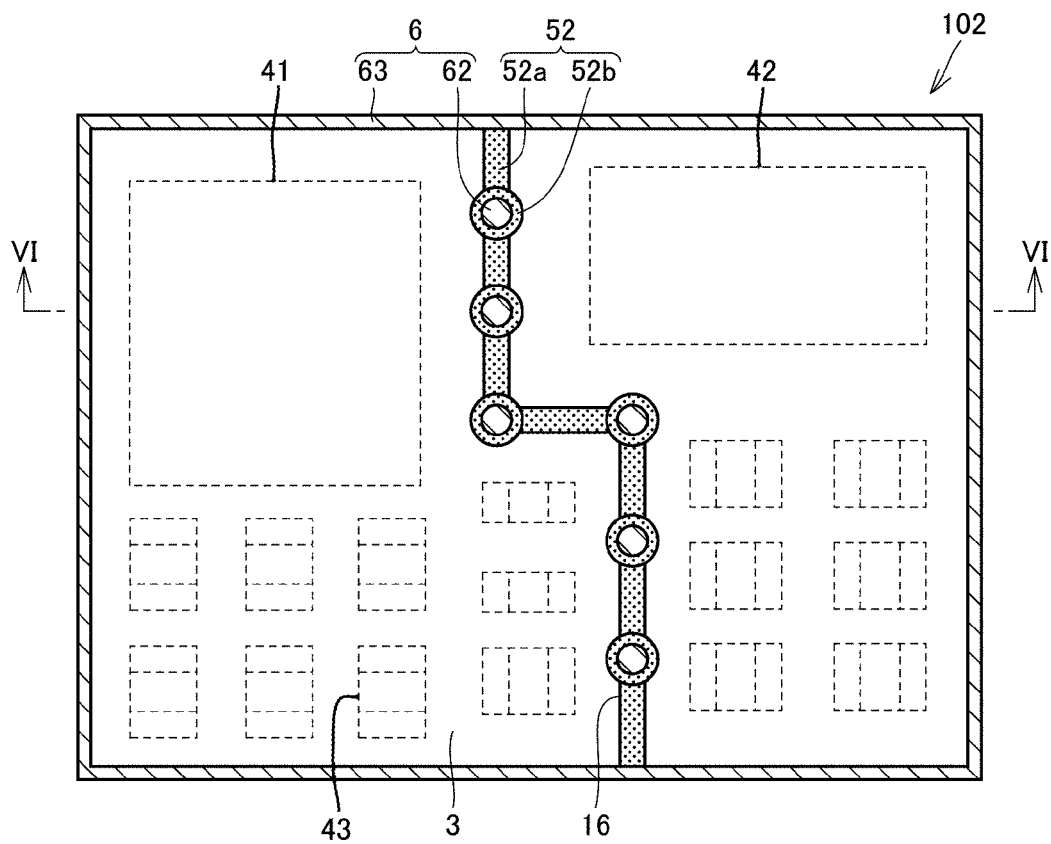
FIG. 5 is a plan view of a module according to Embodiment 2 based on the present disclosure.
Figure 6:
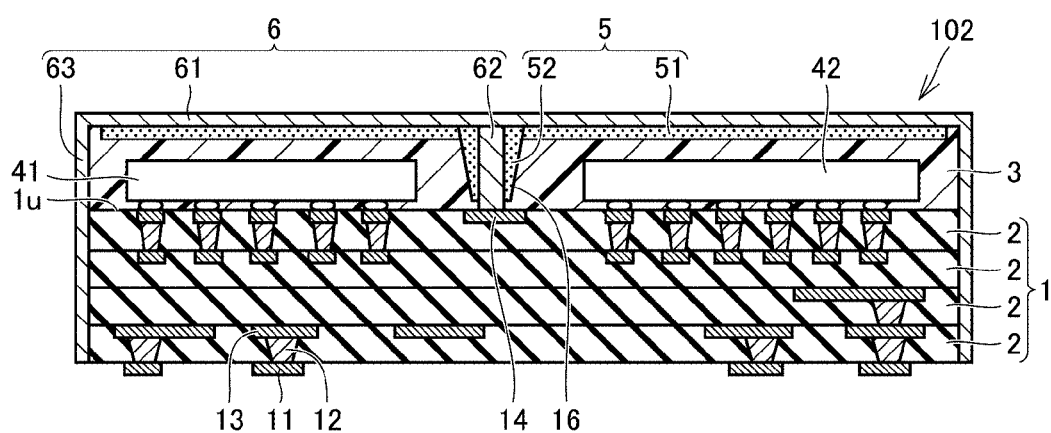
FIG. 6 is a sectional view taken along the line VI-VI in FIG. 5.

A module according to Embodiment 2 based on the present disclosure will be described with reference to FIGS. 5 to 6. A plan view of a module 102 according to the present embodiment is illustrated in FIG. 5. FIG. 5 corresponds to a view, viewed from an upper side, of a state in which an upper surface of the conductive layer 6 of the module 102 is removed. A sectional view taken along the line VI-VI in FIG. 5 is illustrated in FIG. 6. The configuration of the module 102 is basically similar to that of the module 101 described in Embodiment 1 but differs in the following points.

In the module 102, in a case of being viewed in a direction perpendicular to the principal surface 1*u*, the connecting conductor 62 is surrounded by the magnetic wall member 52. The connecting conductor 62 is in a circular cylindrical shape, for example. The connecting conductor 62 may be in a columnar shape instead of the circular cylindrical shape. The connecting conductor 62 may be a metal pin. The connecting conductor 62 may be formed with use of a wire. The magnetic wall member 52 includes portions 52*a* and 52*b*. The portion 52*a* is a linearly extending portion. The portion 52*b* is a portion that surrounds the connecting conductor 62 and that is in a tapered shape.

In the present embodiment as well, a similar effect to that of Embodiment 1 can be obtained.

(Manufacturing Method)

In Embodiment 1, described is a method of forming the connecting conductor 62 by adding the paste of the conductive material, and a similar method may be used in the present embodiment as well. In a case in which the connecting conductor 62 is formed with use of a metal pin, the metal pin may be erected on the principal surface 1*u* in advance. After the metal pin is erected, the sealing resin 3 is formed. The trench 16 is formed in the sealing resin 3 by laser processing or the like. At a position at which the metal pin is provided, removal processing is performed so that the removed region surrounds the metal pin. In this manner, the trench 16 is filled with a paste of a magnetic material. In this manner, the magnetic wall member 52 is formed.

Embodiment 3

Figure 7:
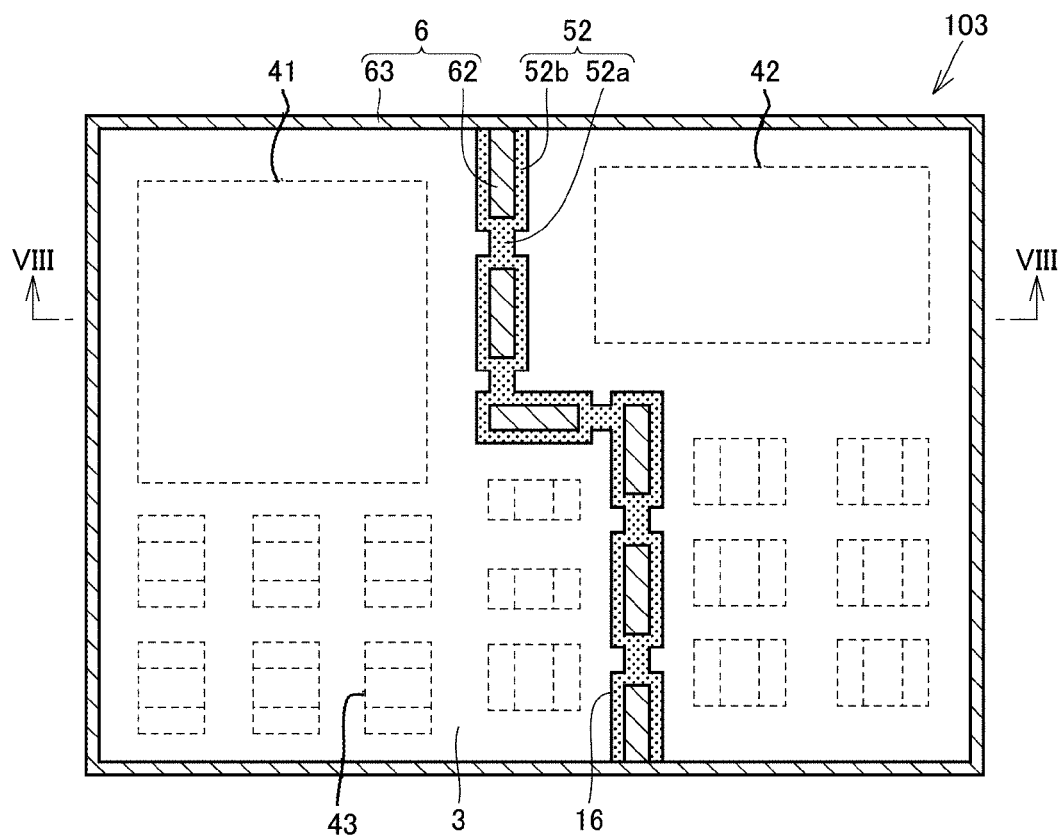
FIG. 7 is a plan view of a module according to Embodiment 3 based on the present disclosure.
Figure 8:
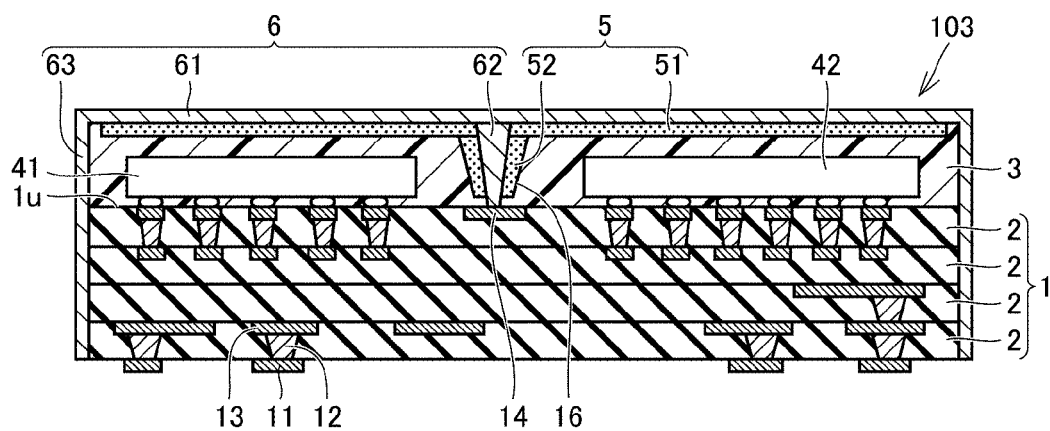
FIG. 8 is a sectional view taken along the line VIII-VIII in FIG. 7.

A module according to Embodiment 3 based on the present disclosure will be described with reference to FIGS. 7 to 8. A plan view of a module 103 according to the present embodiment is illustrated in FIG. 7. FIG. 7 corresponds to a view, viewed from an upper side, of a state in which an upper surface of the conductive layer 6 of the module 103 is removed. A sectional view taken along the line VIII-VIII in FIG. 7 is illustrated in FIG. 8. The configuration of the module 103 is basically similar to that of the module 101 described in Embodiment 1 but differs in the following points.

In the module 103, in a case of being viewed in a direction perpendicular to the principal surface 1*u*, the connecting conductor 62 is surrounded by the magnetic wall member 52. As illustrated in FIG. 7, the connecting conductor 62 is in a rectangular shape in a case of being viewed in a direction perpendicular to the principal surface 1*u*. As illustrated in FIG. 8, the sectional shape of the connecting conductor 62 may be a tapered shape. The magnetic wall member 52 includes a portion 52*a* and a portion 52*b*. The portion 52*a* is a linearly extending portion. The portion 52*b* is a portion that surrounds the connecting conductor 62 in a rectangular shape and that is in a tapered shape. In the example illustrated here, the portions 52*b* are connected to each other by the portion 52*a*. The magnetic wall member 52 has a configuration in which the portions 52*a* and the portions 52*b* are alternately arranged. Although the portion 52*a* is shorter than the portion 52*b* in FIG. 8, this is not always the case, and the portion 52*a* may be longer than the portion 52*b*.

In the present embodiment as well, a similar effect to that of Embodiment 1 can be obtained. As described in the present embodiment, in a case of being viewed in a direction perpendicular to the principal surface 1*u*, the magnetic wall member 52 can extend continuously over the whole length of the trench 16, and the connecting conductor 62 can extend in a form of a dashed line. By employing this configuration, an electromagnetic shield and a magnetic shield can efficiently be achieved with use of limited materials.

Embodiment 4

Figure 9:
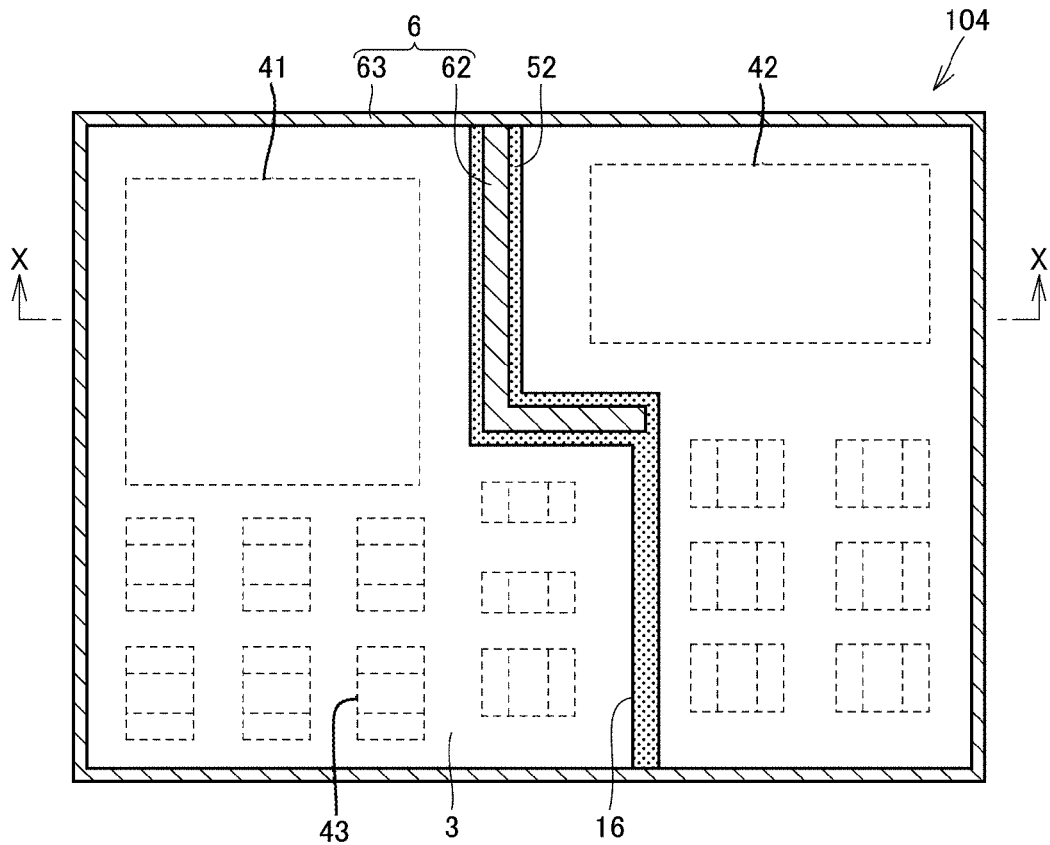
FIG. 9 is a plan view of a module according to Embodiment 4 based on the present disclosure.
Figure 10:
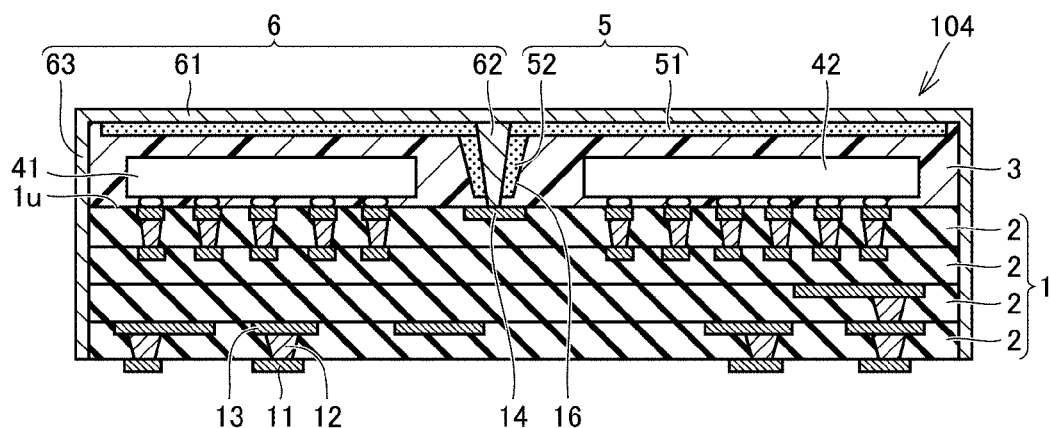
FIG. 10 is a sectional view taken along the line X-X in FIG. 9.

A module according to Embodiment 4 based on the present disclosure will be described with reference to FIGS. 9 to 10. A plan view of a module 104 according to the present embodiment is illustrated in FIG. 9. FIG. 9 corresponds to a view, viewed from an upper side, of a state in which an upper surface of the conductive layer 6 of the module 104 is removed. A sectional view taken along the line X-X in FIG. 9 is illustrated in FIG. 10. The configuration of the module 104 is basically similar to that of the module 101 described in Embodiment 1 but differs in the following points.

In the present embodiment, while the magnetic wall member 52, which is a part of the magnetic member 5, extends over the whole length of the trench 16, the connecting conductor 62, which is a part of the conductive layer 6, extends only halfway in the longitudinal direction of the trench 16. In other words, in the trench 16, there are a zone in which both the conductive layer 6 and the magnetic member 5 extend in parallel and a zone in which only the magnetic member 5 extends. As illustrated in FIG. 9, the connecting conductor 62 may be electrically connected to the portion 63 on one sidewall thereof.

In the present embodiment as well, a similar effect to that of Embodiment 1 can be obtained. In a case in which an electromagnetic shield is desired to be provided only in a specific portion of the whole length of the trench 16, by employing the configuration according to the present embodiment, the electromagnetic shield can efficiently be achieved with use of limited materials.

Embodiment 5

Figure 11:
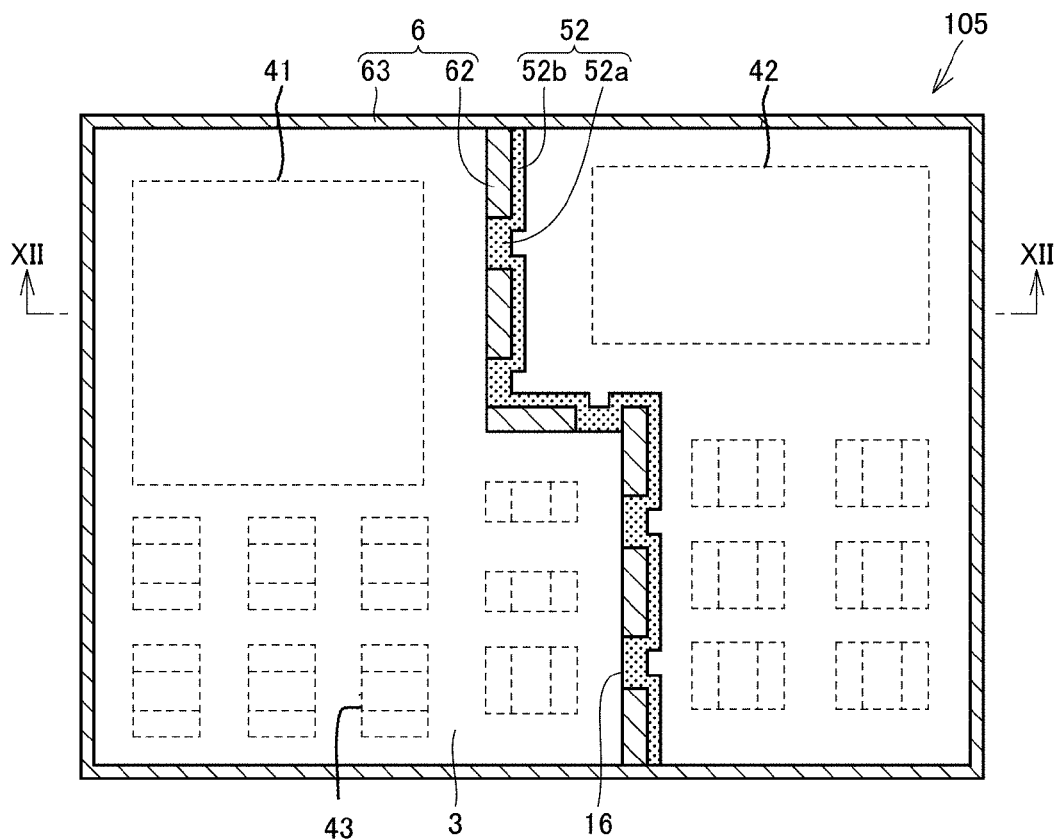
FIG. 11 is a plan view of a module according to Embodiment 5 based on the present disclosure.
Figure 12:
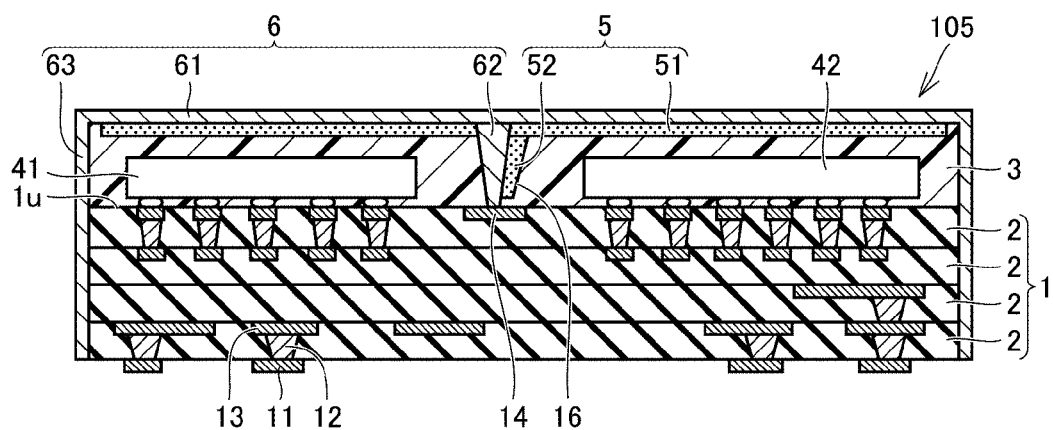
FIG. 12 is a sectional view taken along the line XII-XII in FIG. 11.

A module according to Embodiment 5 based on the present disclosure will be described with reference to FIGS. 11 to 12. A plan view of a module 105 according to the present embodiment is illustrated in FIG. 11. FIG. 11 corresponds to a view, viewed from an upper side, of a state in which an upper surface of the conductive layer 6 of the module 105 is removed. A sectional view taken along the line XII-XII in FIG. 11 is illustrated in FIG. 12. The configuration of the module 105 is basically similar to that of the module 103 described in Embodiment 3 but differs in the following points.

In the present embodiment, the connecting conductor 62 is exposed to one side of the trench 16. In a case in which attention is focused on the sectional shape of the trench 16, the side surface of the trench 16 on a side on which the connecting conductor 62 is exposed may be flat. On the opposite side, the side surface of the trench 16 is uneven.

In the present embodiment as well, a similar effect to that of Embodiment 1 can be obtained.

Embodiment 6

Figure 13:
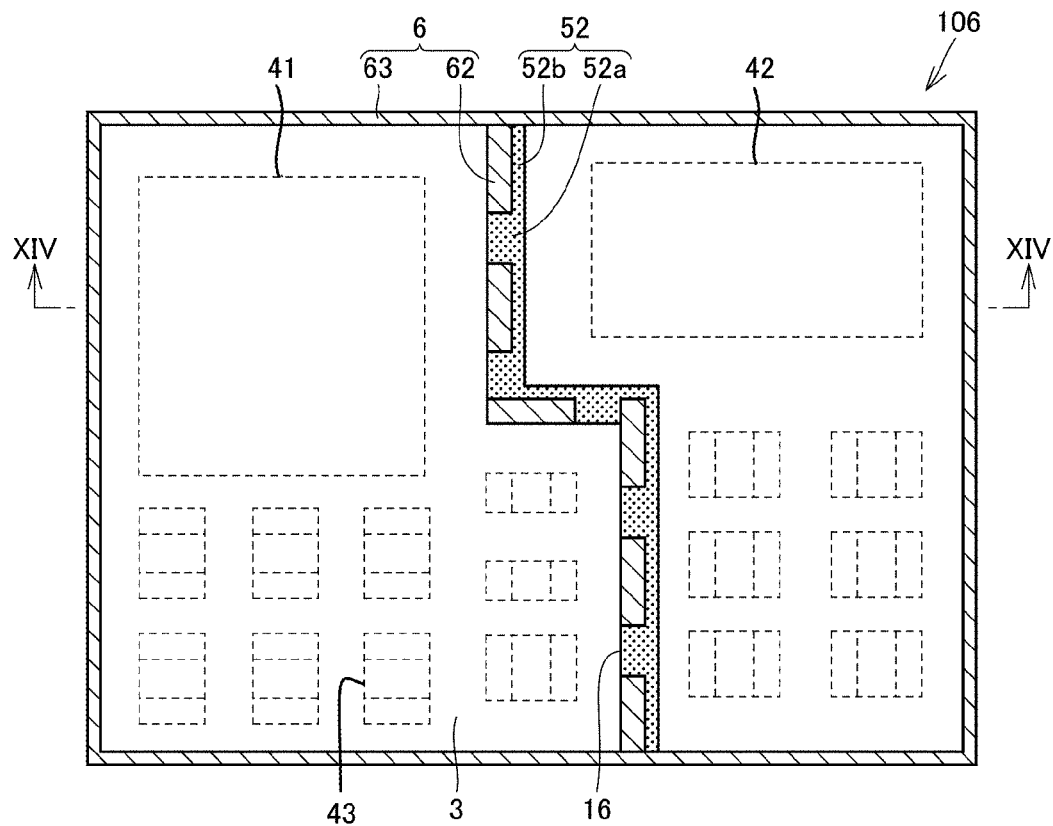
FIG. 13 is a plan view of a module according to Embodiment 6 based on the present disclosure.
Figure 14:
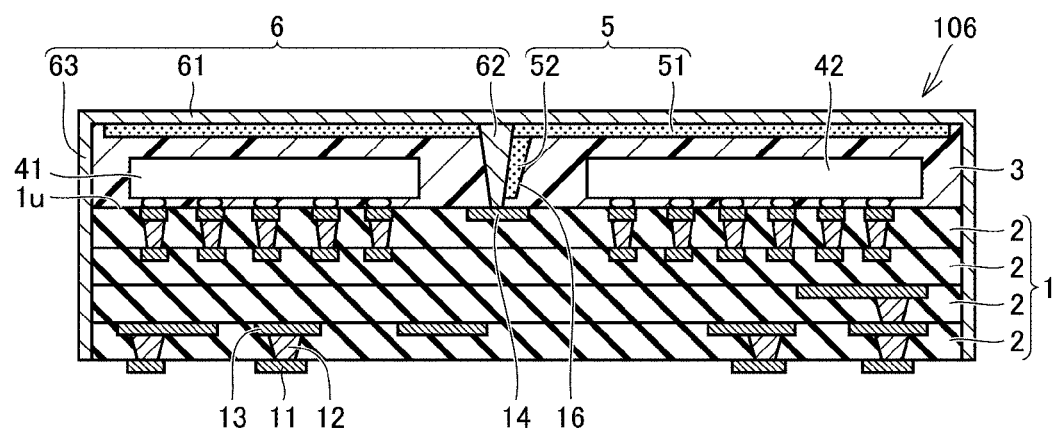
FIG. 14 is a sectional view taken along the line XIV-XIV in FIG. 13.

A module according to Embodiment 6 based on the present disclosure will be described with reference to FIGS. 13 to 14. A plan view of a module 106 according to the present embodiment is illustrated in FIG. 13. FIG. 13 corresponds to a view, viewed from an upper side, of a state in which an upper surface of the conductive layer 6 of the module 106 is removed. A sectional view taken along the line XIV-XIV in FIG. 13 is illustrated in FIG. 14. The configuration of the module 106 is basically similar to that of the module 105 described in Embodiment 5 but differs in the following points.

In the present embodiment, in a case in which attention is focused on the sectional shape of the trench 16, the side surface of the trench 16 on a side on which the connecting conductor 62 is exposed is flat, and the side surface of the trench 16 on the opposite side is also flat.

In the present embodiment as well, a similar effect to that of Embodiment 1 can be obtained.

Embodiment 7

Figure 15:
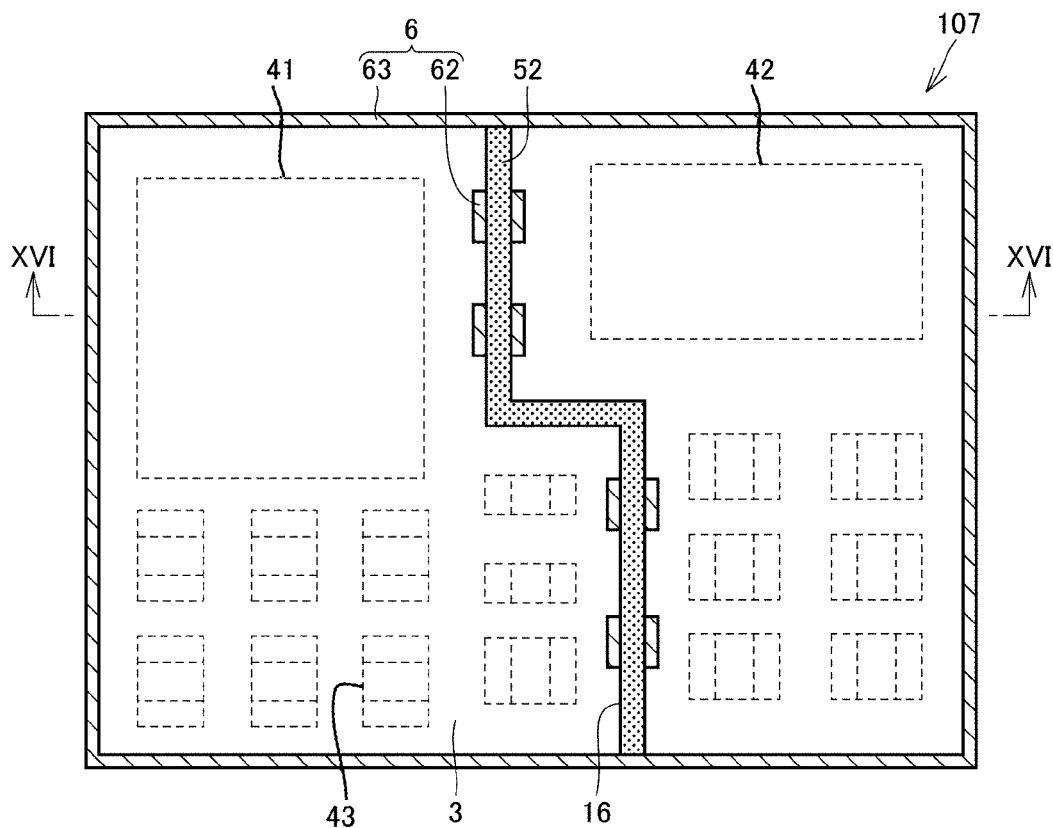
FIG. 15 is a plan view of a module according to Embodiment 7 based on the present disclosure.
Figure 16:
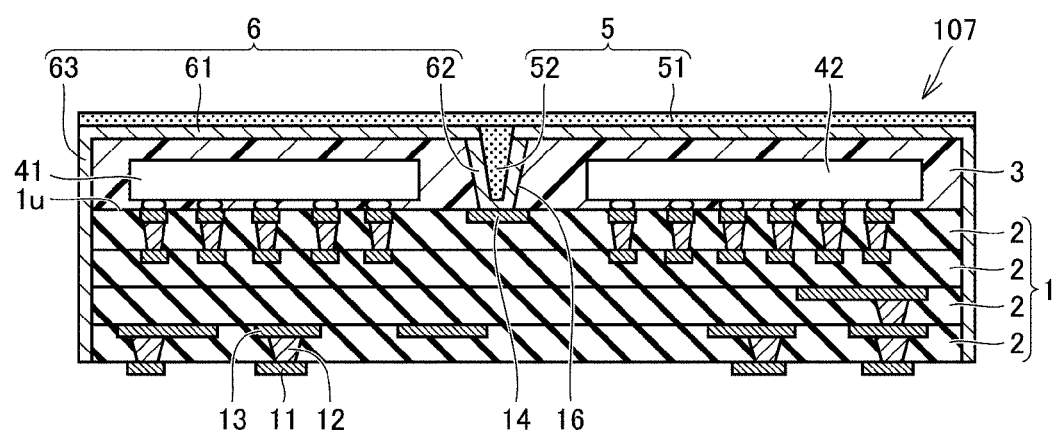
FIG. 16 is a sectional view taken along the line XVI-XVI in FIG. 15.

A module according to Embodiment 7 based on the present disclosure will be described with reference to FIGS. 15 to 16. A plan view of a module 107 according to the present embodiment is illustrated in FIG. 15. FIG. 15 corresponds to a view, viewed from an upper side, of a state in which an upper surface of the conductive layer 6 of the module 107 is removed. A sectional view taken along the line XVI-XVI in FIG. 15 is illustrated in FIG. 16. The configuration of the module 107 is basically similar to that of the module 101 described in Embodiment 1 but differs in the following points.

In the present embodiment, the magnetic wall member 52 extends linearly in a uniform width. The connecting conductor 62 sandwiches the magnetic wall member 52 from both sides at a portion in the middle of the magnetic wall member 52. The connecting conductor 62 is arranged along the magnetic wall member 52 over a limited length. In the present embodiment, the plurality of connecting conductors 62 all have an equal length and may have different lengths. The connecting conductors 62 are not necessarily arranged at equal spaces.

In the present embodiment as well, a similar effect to that of Embodiment 1 can be obtained. In a case in which the plurality of connecting conductors 62 are arranged, more connecting conductors 62 may be arranged in a zone in which the electromagnetic shield is to be provided particularly in a concentrated manner.

Embodiment 8

Figure 17:
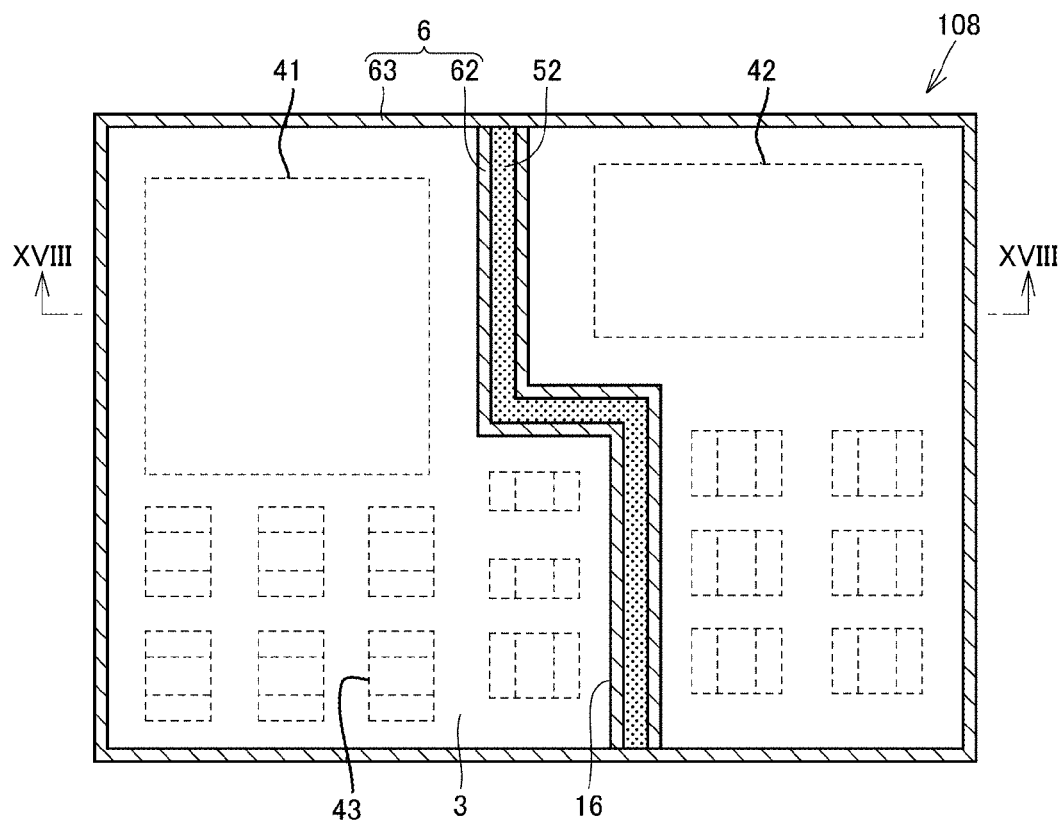
FIG. 17 is a plan view of a module according to Embodiment 8 based on the present disclosure.
Figure 18:
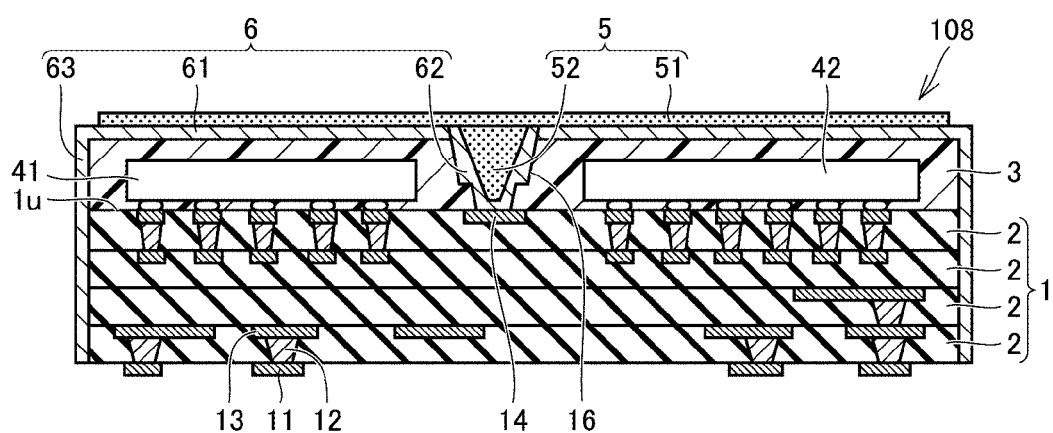
FIG. 18 is a sectional view taken along the line XVIII-XVIII in FIG. 17.

A module according to Embodiment 8 based on the present disclosure will be described with reference to FIGS. 17 to 18. A plan view of a module 108 according to the present embodiment is illustrated in FIG. 17. FIG. 17 corresponds to a view, viewed from an upper side, of a state in which an upper surface of the conductive layer 6 of the module 108 is removed. A sectional view taken along the line XVIII-XVIII in FIG. 17 is illustrated in FIG. 18.

In the module 108 according to the present embodiment, the connecting conductor 62 and the magnetic shield wall-shaped portion 52 both fill the trench 16 in a state of being formed in the trench 16. Although the module 108 is similar to the module 101 described in Embodiment 1 in this respect, contrary to the case in the module 101, the magnetic wall member 52 is located inside while the connecting conductor 62 is located outside. The connecting conductor 62 that extends linearly sandwiches both sides of the magnetic wall member 52 that extends linearly. Since the configuration of the other portions is similar to that described in Embodiment 1, the description will not be repeated.

In the present embodiment as well, a similar effect to that of Embodiment 1 can be obtained.

(Manufacturing Method)

The structure described in the present embodiment can be manufactured in the following manner. First, the sealing resin 3 is formed so as to seal the electronic components 41, 42, and the like mounted on the principal surface 1u. The trench 16 is formed in the sealing resin 3 by laser processing or the like. The trench 16 is filled with a paste of a conductive material. In this manner, the connecting conductor 62 is formed. Subsequently, a groove for the magnetic wall member 52 is formed by laser processing or the like again in a shorter width than the whole width of the trench 16. This groove is filled with a paste of a magnetic material. In this manner, the magnetic wall member 52 is formed. As a result, a structure can be obtained in which, in a case in which the trench 16 is viewed in a sectional view, the connecting conductor 62 is arranged in a U shape or a V shape inside the trench 16, and in which the magnetic wall member 52 is arranged inside the connecting conductor 62. Subsequently, the magnetic plate member 51 is formed. The magnetic plate member 51 can be formed by a method, such as application of a paste of a magnetic material, attachment of a magnetic material sheet, and plating of a magnetic material.

Embodiment 9

Figure 19:
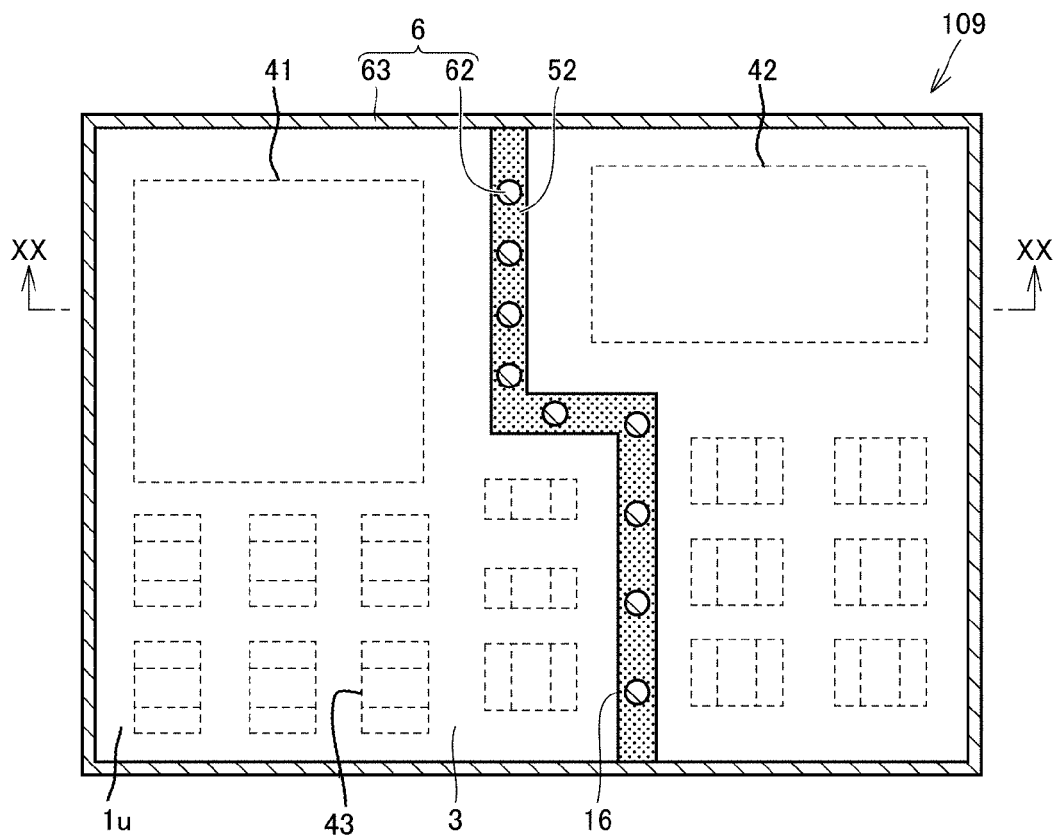
FIG. 19 is a plan view of a module according to Embodiment 9 based on the present disclosure.
Figure 20:
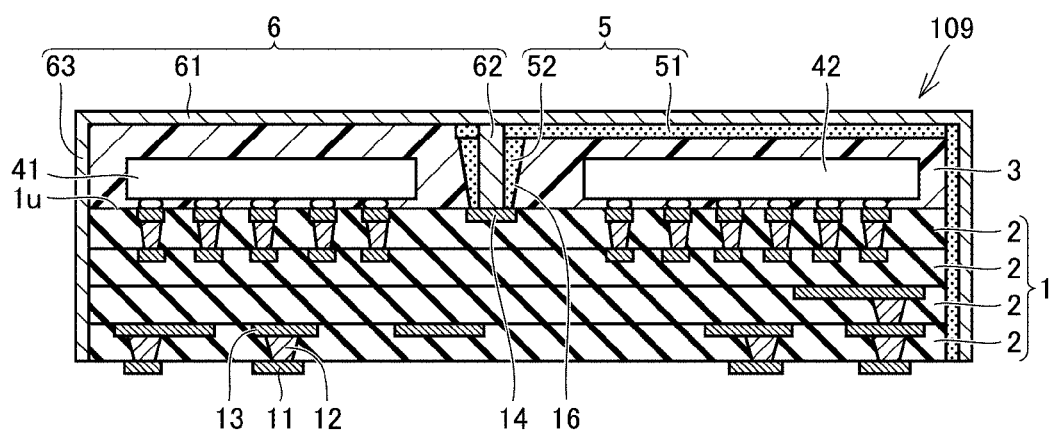
FIG. 20 is a sectional view taken along the line XX-XX in FIG. 19.

A module according to Embodiment 9 based on the present disclosure will be described with reference to FIGS. 19 to 20. A plan view of a module 109 according to the present embodiment is illustrated in FIG. 19. FIG. 19 corresponds to a view, viewed from an upper side, of a state in which an upper surface of the conductive layer 6 of the module 109 is removed. A sectional view taken along the line XX-XX in FIG. 19 is illustrated in FIG. 20.

In the module 109 according to the present embodiment, the connecting conductor 62 and the magnetic shield wall-shaped portion 52 both fill the trench 16 in a state of being formed in the trench 16. Also, in the module 109, in a case of being viewed in a direction perpendicular to the principal surface 1u, the connecting conductor 62 is surrounded by the magnetic wall member 52. Although the module 109 is similar to the module 102 described in Embodiment 2 in this respect, unlike the case in the module 102, the side surface of the magnetic wall member 52 is flat. While the magnetic wall member 52 may be in a tapered shape in a sectional view as illustrated in FIG. 20, the outline of the magnetic wall member 52 is in a linear shape in a planar view as illustrated in FIG. 19. Metal pins serving as the connecting conductors 62 are erected in the trench 16. The connecting conductors 62 may or may not be arranged at equal spaces. The connecting conductors 62 may be formed with use of wires instead of the metal pins. The trench 16 may be in a shape of a polygonal line as illustrated in FIG. 19. Since the configuration of the other portions is similar to that described in Embodiment 1 or 2, the description will not be repeated.

In the present embodiment as well, a similar effect to that of Embodiment 2 can be obtained.

Embodiment 10

Figure 21:
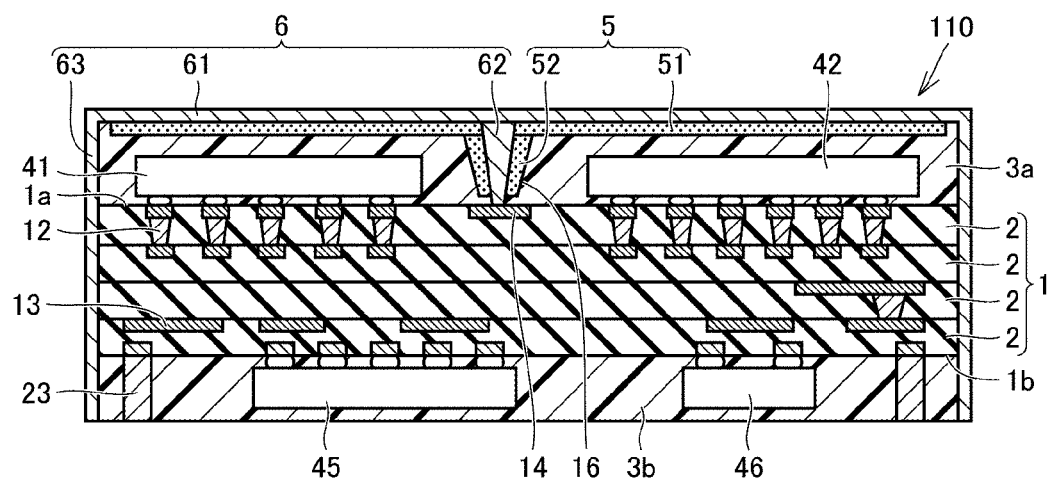
FIG. 21 is a sectional view of a module according to Embodiment 10 based on the present disclosure.

A module according to Embodiment 10 based on the present disclosure will be described with reference to FIG. 21. A sectional view of a module 110 according to the present embodiment is illustrated in FIG. 21. The module 110 according to the present embodiment is similar to the module 101 described in Embodiment 1 in terms of the basic configuration but has the following configuration.

The module 110 has a double-sided mounting structure. That is, in the module 110, the substrate 1 includes a principal surface 1a and a second principal surface 1b as a surface opposite to the principal surface 1a. The module 110 is provided with a second electronic component arranged on the second principal surface 1b. That is, in the module 110, electronic components 45 and 46 are mounted on the second principal surface 1b, for example. As the "second electronic component", at least one electronic component may be arranged. The electronic components 41 and 42 are sealed with a sealing resin 3a. The electronic components 45 and 46 are sealed with a second sealing resin 3b. The electronic components 45 and 46 may be exposed from the second sealing resin 3b. The module 110 is provided with a columnar conductor 23 as an external terminal provided on the second principal surface 1b. The columnar conductor 23 penetrates the second sealing resin 3b. In the example illustrated here, the lower surface of the columnar conductor 23 is exposed to the outside. The columnar conductor 23 may be either a convexity electrode or a metal pin. The columnar conductor 23 may be formed by plating. A solder bump may be connected to the lower end of the columnar conductor 23.

The configuration of the external terminal illustrated here is illustrative only and is not always the case. For example, a solder bump may be used instead of the columnar conductor 23.

Note that, in each of the embodiments, an example in which the magnetic plate member 51 is formed so as to cover the upper surface side of the sealing resin 3 has been raised, and that the present disclosure is not limited to this example. For example, the magnetic plate member may be formed so as to cover the side surface of the sealing resin 3 or may be formed only at a portion requiring a magnetic shield.

Note that some of the above-described embodiments may appropriately be combined and employed. For example, in any of the configurations in Embodiments 2 to 9, a double-sided mounting structure as in Embodiment 10 may be employed.

Note that the embodiments disclosed here are illustrative only and are not limitative in all respects. The scope of the present disclosure is defined by the claims, and the present disclosure includes any modifications within the meaning and scope equivalent to those of the claims.

DESCRIPTION OF REFERENCE SYMBOLS

1: Substrate
1a, 1u: Principal surface
1b: Second principal surface
2: Insulating layer
3, 3a: Sealing resin
3b: Second sealing resin
5: Magnetic member
6: Conductive layer
11: External connection electrode
12: Conductor via
13: Internal conductor pattern
14: Ground electrode
16: Trench
23: Columnar conductor
41, 42, 43, 45, 46: Electronic component
51: Magnetic plate member
52: Magnetic wall member
52a, 52b: Portion (of magnetic wall member)
61: Portion (of conductive layer covering upper surface of sealing resin)
62: Connecting conductor (of conductive layer penetrating sealing resin)
63: Portion (of conductive layer covering side surface of sealing resin)
101, 102, 103, 104, 105, 106, 107, 108, 109: Module

The invention claimed is:

1. A module comprising:
a substrate including a principal surface;
a plurality of electronic components on the principal surface;
a sealing resin covering the principal surface and the plurality of electronic components and including a trench between any of the plurality of electronic components;
a ground electrode on the principal surface;
a conductive layer covering the sealing resin; and
a magnetic member,
wherein the conductive layer is electrically connected to the ground electrode by a connecting conductor penetrating the sealing resin,
wherein the magnetic member includes a magnetic plate member covering the sealing resin and a magnetic wall member in a wall shape in the trench, and
wherein both the connecting conductor and the magnetic wall member fill the trench.

2. The module according to claim 1, wherein the connecting conductor is connected to the ground electrode, and the magnetic member is not connected to the ground electrode.

3. The module according to claim 1, wherein when viewed in a direction perpendicular to the principal surface, the connecting conductor is surrounded by the magnetic wall member.

4. The module according to claim 1, wherein, when viewed in a direction perpendicular to the principal surface, the connecting conductor and the magnetic wall member extend in parallel.

5. The module according to claim 1, wherein when viewed in a direction perpendicular to the principal surface, the magnetic wall member extends continuously over a whole length of the trench, and the connecting conductor intermittently extends in a form of a dashed line.

6. The module according to claim 1, wherein the magnetic member contains an alloy comprising an Fe—Co-based alloy or an Fe—Ni-based alloy or a combination of the Fe—Co-based alloy and the Fe—Ni-based alloy, a ferrite material comprising NiZn or MnZn or a combination of NiZn and MnZn, or a permalloy plating.

7. The module according to claim 1, wherein the substrate further includes a second principal surface as a surface opposite to the principal surface, the module further comprising:
a second electronic component on the second principal surface;
a second sealing resin covering the second principal surface and the second electronic component; and
an external terminal on the second principal surface.

8. The module according to claim 2, wherein when viewed in a direction perpendicular to the principal surface, the connecting conductor is surrounded by the magnetic wall member.

9. The module according to claim 2, wherein, when viewed in a direction perpendicular to the principal surface, the connecting conductor and the magnetic wall member extend in parallel.

10. The module according to claim 2, wherein when viewed in a direction perpendicular to the principal surface, the magnetic wall member extends continuously over a whole length of the trench, and the connecting conductor intermittently extends in a form of a dashed line.

11. The module according to claim 3, wherein when viewed in a direction perpendicular to the principal surface, the magnetic wall member extends continuously over a whole length of the trench, and the connecting conductor intermittently extends in a form of a dashed line.

12. The module according to claim 4, wherein when viewed in a direction perpendicular to the principal surface, the magnetic wall member extends continuously over a whole length of the trench, and the connecting conductor intermittently extends in a form of a dashed line.

13. The module according to claim 2, wherein the magnetic member contains an alloy comprising an Fe—Co-based alloy or an Fe—Ni-based alloy or a combination of the Fe—Co-based alloy and the Fe—Ni-based alloy, a ferrite material comprising NiZn or MnZn or a combination of NiZn and MnZn, or a permalloy plating.

14. The module according to claim 3, wherein the magnetic member contains an alloy comprising an Fe—Co-based alloy or an Fe—Ni-based alloy or a combination of the Fe—Co-based alloy and the Fe—Ni-based alloy, a ferrite material comprising NiZn or MnZn or a combination of NiZn and MnZn, or a permalloy plating.

15. The module according to claim 4, wherein the magnetic member contains an alloy comprising an Fe—Co-based alloy or an Fe—Ni-based alloy or a combination of the Fe—Co-based alloy and the Fe—Ni-based alloy, a ferrite material comprising NiZn or MnZn or a combination of NiZn and MnZn, or a permalloy plating.

16. The module according to claim 5, wherein the magnetic member contains an alloy comprising an Fe—Co-based alloy or an Fe—Ni-based alloy or a combination of the Fe—Co-based alloy and the Fe—Ni-based alloy, a ferrite material comprising NiZn or MnZn or a combination of NiZn and MnZn, or a permalloy plating.

17. The module according to claim 2, wherein the substrate further includes a second principal surface as a surface opposite to the principal surface, the module further comprising:
a second electronic component on the second principal surface;
a second sealing resin covering the second principal surface and the second electronic component; and
an external terminal on the second principal surface.

18. The module according to claim 3, wherein the substrate further includes a second principal surface as a surface opposite to the principal surface, the module further comprising:
a second electronic component on the second principal surface;
a second sealing resin covering the second principal surface and the second electronic component; and
an external terminal on the second principal surface.

19. The module according to claim 4, wherein the substrate further includes a second principal surface as a surface opposite to the principal surface, the module further comprising:
a second electronic component on the second principal surface;
a second sealing resin covering the second principal surface and the second electronic component; and
an external terminal on the second principal surface.

20. The module according to claim 5, wherein the substrate further includes a second principal surface as a surface opposite to the principal surface, the module further comprising:
a second electronic component on the second principal surface;
a second sealing resin covering the second principal surface and the second electronic component; and
an external terminal on the second principal surface.

\* \* \* \* \*